United States Patent
Chan et al.

(10) Patent No.: US 6,764,947 B1
(45) Date of Patent: Jul. 20, 2004

(54) METHOD FOR REDUCING GATE LINE DEFORMATION AND REDUCING GATE LINE WIDTHS IN SEMICONDUCTOR DEVICES

(75) Inventors: Darin Chan, Campbell, CA (US); Douglas J. Bonser, Austin, TX (US); Marina V. Plat, San Jose, CA (US); Marilyn I. Wright, Austin, TX (US); Chih Yuh Yang, San Jose, CA (US); Lu You, San Jose, CA (US); Scott A. Bell, San Jose, CA (US); Philip A. Fisher, Foster City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/366,801

(22) Filed: Feb. 14, 2003

(51) Int. Cl.⁷ .................. H01L 21/4763; H01L 21/302; H01L 21/461
(52) U.S. Cl. .................. 438/645; 438/706; 438/639
(58) Field of Search .................. 438/645, 706, 438/639, 692, 638, 666, 906, 782, 761

(56) References Cited

U.S. PATENT DOCUMENTS

| | | | | |
|---|---|---|---|---|
| 5,721,090 A | * | 2/1998 | Okamoto et al. | 430/313 |
| 5,843,841 A | * | 12/1998 | Izawa et al. | 438/666 |
| 5,850,096 A | * | 12/1998 | Izawa et al. | 257/377 |
| 5,976,973 A | * | 11/1999 | Ohira et al. | 438/645 |
| 6,025,273 A | * | 2/2000 | Chen et al. | 438/706 |
| 6,150,272 A | * | 11/2000 | Liu et al. | 438/692 |
| 6,165,898 A | * | 12/2000 | Jang et al. | 438/638 |
| 6,350,390 B1 | * | 2/2002 | Liu et al. | 438/714 |
| 6,475,888 B1 | * | 11/2002 | Sohn | 438/535 |
| 6,500,756 B1 | * | 12/2002 | Bell et al. | 438/639 |
| 6,506,534 B1 | * | 1/2003 | Nozaki et al. | 430/270.1 |

* cited by examiner

*Primary Examiner*—John F. Niebling
*Assistant Examiner*—Walter L. Lindsay, Jr.
(74) *Attorney, Agent, or Firm*—Foley & Lardner, LLP

(57) ABSTRACT

A silicon oxide stress relief portion is provided between an amorphous carbon hardmask and a polysilicon layer to be etched to form a gate line. The stress relief portion relieves stress between the hardmask and the polysilicon, thereby reducing the risk of delamination of the hardmask prior to patterning of the polysilicon. The stress relief portion may be trimmed prior to patterning and used as an etch mask for patterning the polysilicon. The amorphous carbon hardmasked may be trimmed prior to patterning the stress relief portion to achieve a further reduction in gate line width.

13 Claims, 5 Drawing Sheets

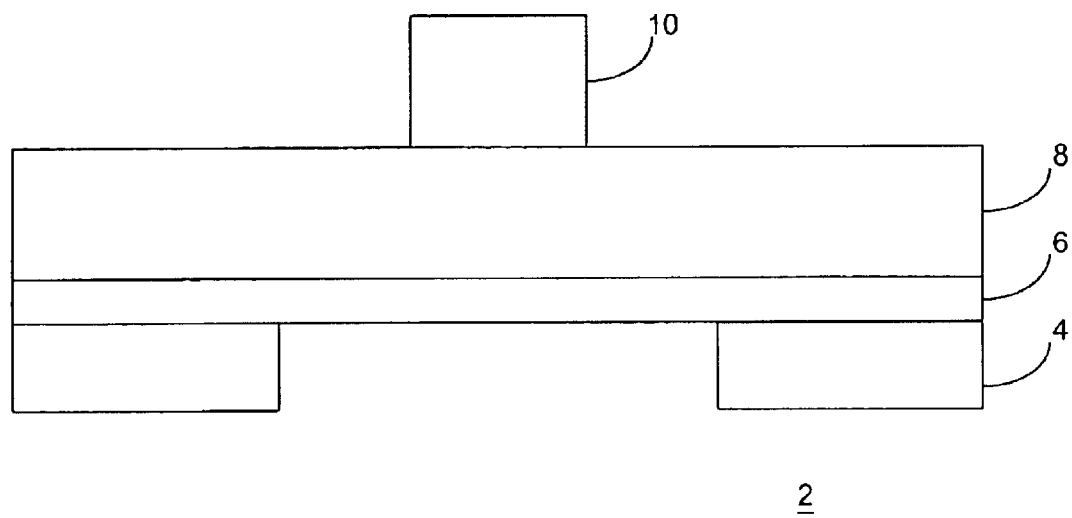
Figure 1
Prior Art
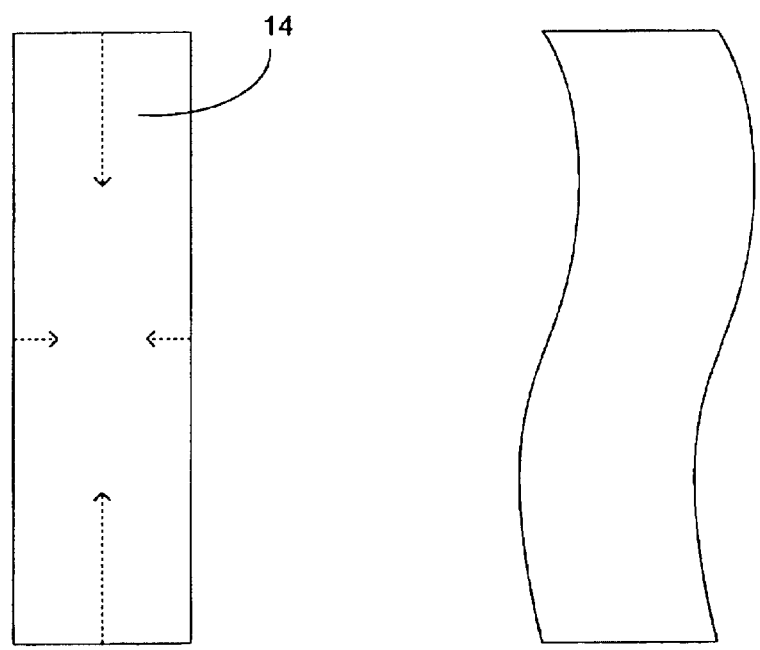
Figur 2a        Figure 2b

ND FOR REDUCING GATE LINE
METHOD FOR REDUCING GATE LINE DEFORMATION AND REDUCING GATE LINE WIDTHS IN SEMICONDUCTOR DEVICES

BACKGROUND OF THE INVENTION

1. Field of the Invention

Embodiments of the invention relate to semiconductor device fabrication, and in particular, to methods for reducing gate line deformation and for reducing gate line widths in semiconductor devices.

2. Background Technology

Current semiconductor manufacturing uses a variety of techniques to achieve sub-100 nm gate line widths.

One technique involves the use of amorphous carbon as a hardmask material for patterning polysilicon to form gate lines. FIG. 1 shows a structure used in the formation of a gate line using this technique. The structure includes a semiconductor substrate 2 having shallow trench isolations 4 that bound an area in which a MOSFET is to be formed. A gate insulating layer 6 such as silicon oxide and a gate conductive layer 8 such as doped polysilicon are formed over the substrate and will be patterned to form a gate line and gate insulator of the MOSFET. Formed over the gate conductive layer 8 is an amorphous carbon hardmask 10. The underlying gate conductive layer 8 is patterned using the amorphous carbon hardmask 10 as an etch mask. After patterning, the residual portion of the amorphous carbon hardmask is easily removed by an ashing process in an oxygen or hydrogen atmosphere.

One problem associated with the use of amorphous carbon hardmasks for patterning of polysilicon is delamination of the amorphous carbon from the underlying polysilicon. FIGS. 2a and 2b illustrate this problem. FIG. 2a shows a top view of a patterned amorphous carbon hardmask for patterning a polysilicon gate line. Lattice mismatches between the amorphous carbon and the underlying polysilicon on which it is grown impart compressive forces 14 to the amorphous carbon. As the width of the line decreases relative to its length, the compressive stress along the length of the line become increasingly greater than the stress across the width of the line. So long as there is a layer of material such as an SiON capping layer overlying the amorphous carbon, the compressive stress within the amorphous carbon is restrained. However, when overlying layers are removed or become thin, the internal compressive stress of the amorphous carbon is no longer restrained, and the amorphous carbon delaminates from the underlying polysilicon and may assume a "squiggle" pattern as shown in FIG. 2b that effectively lengthens the line to relieve the compressive stress. The deformed pattern of the delaminated line will be reproduced in the polysilicon upon further etching, resulting in a deformed gate line.

Consequently, there is a need for methods that avoid the amorphous carbon delamination problem of the conventional method.

Another technique for achieving sub-100 nm gate lines involves trimming of photoresist masks by isotropic etching to reduce photoresist mask feature sizes to below the minimum photoresist feature size achievable through projection lithography. The trimmed photoresist mask is used to pattern an underlying gate conductive layer such as polysilicon, resulting in a gate line that has a width less than the minimum achievable photoresist feature size. However, the resist trim technique is limited by the need to retain a minimum thickness of photoresist in order to accurately transfer the pattern of the photoresist mask to the underlying polysilicon layer. Therefore the trimming process must be terminated before that minimum thickness has been reached. This limits the reductions in gate size that can be achieved by the resist trim technique.

Amorphous carbon hardmasks may also be reduced in size by trimming techniques. However, amorphous carbon hardmasks are also subject to thickness limitations that limit the degree to which they may be trimmed, and are more likely to suffer delamination when trimmed.

Consequently, there is also a need for techniques for reducing gate widths that are not subject to the limitations of the photoresist trim technique.

SUMMARY OF THE DISCLOSURE

It is an object of the present invention to improve over the aforementioned conventional methods by reducing the occurrence of gate line deformation and by providing an alternative to the photoresist trim technique for reducing gate line widths.

In accordance with one embodiment of the present invention, a silicon oxide stress relief portion is provided between an amorphous carbon hardmask and a polysilicon gate conductive layer. The stress relief provided by the silicon oxide stress relief portion reduces the likelihood of delamination of the amorphous carbon from the underlying polysilicon. In a preferred implementation of this embodiment, the silicon oxide stress relief portion is subjected to a selective isotropic etch that trims the width of the silicon oxide, resulting in the formation of a trimmed silicon oxide stress relief portion that has a width that is less than the width of the amorphous carbon hardmask. The trimmed stress relief portion may then be used as an etch mask to pattern the underlying polysilicon.

In another embodiment of the invention, a stress relief portion is provided between a hardmask and a gate conductive layer. The stress relief portion is then subjected to a selective isotropic etch that trims the width of the stress relief portion so that it has a width less than the width of the hardmask. The hardmask may then be removed and the trimmed stress relief portion may be used to pattern the underlying gate conductive layer.

BRIEF DESCRIPTION OF THE DRAWINGS

Preferred embodiments of the invention will hereafter be described with reference to the accompanying drawings, wherein like numerals denote like elements, and in which:

FIG. 1 shows a side view of a semiconductor structure fabricated according to prior art techniques;

FIGS. 2a and 2b show the effect of amorphous carbon hardmask delamination in a structure formed according to conventional techniques;

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

Figure 3A:
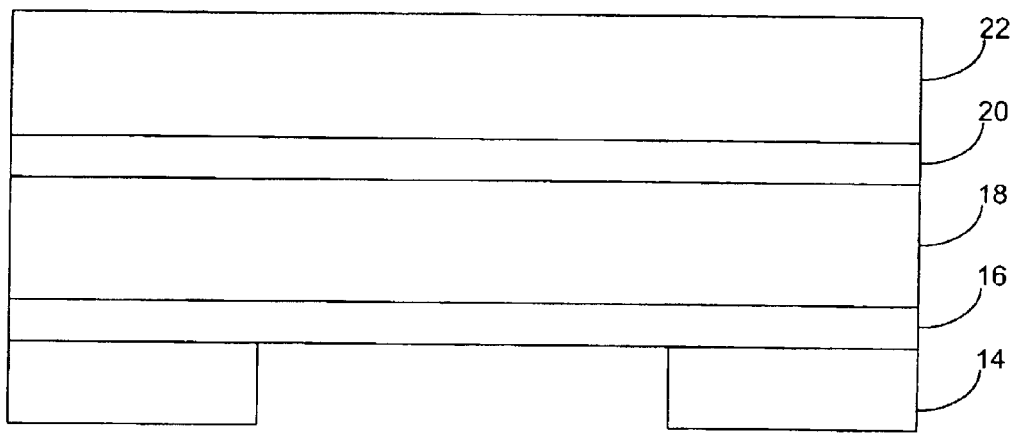
FIGS. 3a, 3b, 3c and 3d show structures formed during processing in accordance with a preferred embodiment of the invention.

FIGS. 3a–3d show structures formed during processing in accordance with a preferred embodiment of the invention. FIG. 3a shows a structure including a semiconductor substrate 12 comprising shallow trench isolations 14 that define boundaries of an active region in which a MOSFET is to be formed. A silicon oxide gate insulating layer 16 is formed over the silicon substrate 12 and a polysilicon gate conductive layer 18 is formed over the gate insulating layer 16. Formed over the polysilicon gate conductive layer 18 are a silicon oxide stress relief layer 20 and an amorphous carbon hardmask layer 22. The silicon oxide stress relief layer 20 may be formed in a variety of manners, such as by oxidation of the underlying polysilicon layer, or by chemical vapor deposition. The amorphous carbon hardmask layer 22 may be doped, such as with nitrogen, to improve its etch selectivity relative to the polysilicon gate conductive material. Although not shown in FIG. 3a, additional layers, such as a SiON capping layer, may be formed over the amorphous carbon hardmask layer 22.

Figure 3B:
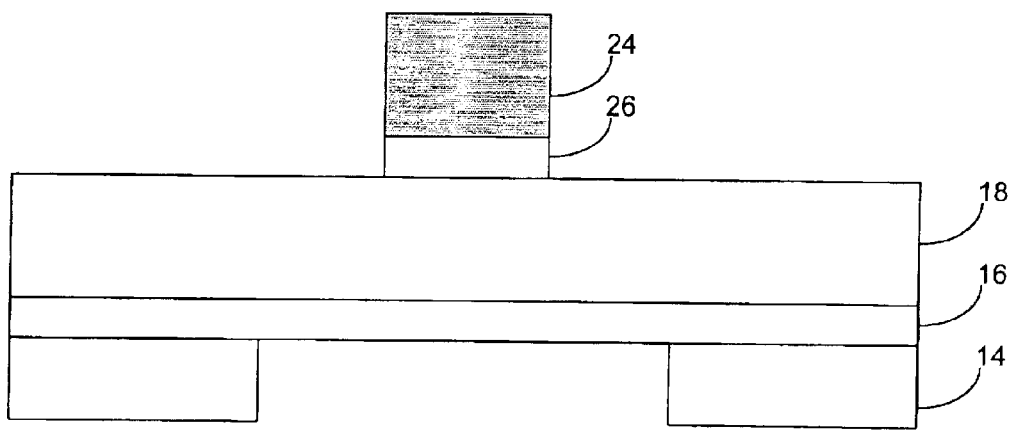

FIG. 3b shows the structure of FIG. 3a after patterning of the amorphous carbon hardmask layer and the silicon oxide stress relief layer (as well as any overlying layers) to form an amorphous carbon hardmask 24 and a silicon oxide stress relief portion 26 that is self aligned with the amorphous carbon hardmask 24. The stress relief portion 26 serves as a buffer against stress caused by lattice mismatches between the polysilicon gate conductive layer 18 and the amorphous carbon hardmask 24, reducing the likelihood that delamination due to such stress will occur even in the case of long thin lines.

Figure 3C:
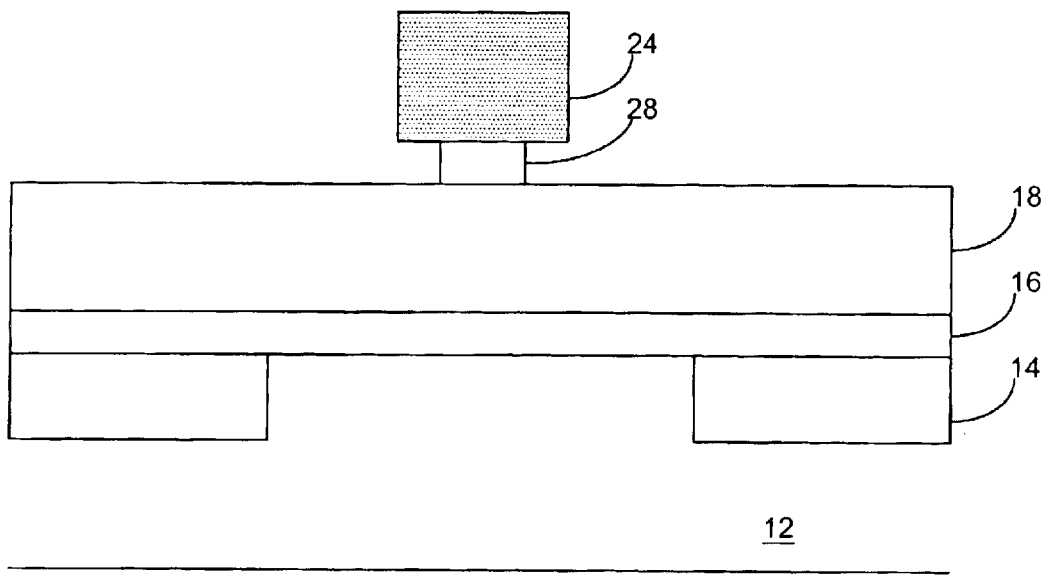

FIG. 3c shows the structure of FIG. 3b after selectively isotropically etching the silicon oxide stress relief portion. The etch trims the silicon oxide stress relief portion such that its width is less than the width of the amorphous carbon hardmask, resulting in a trimmed silicon oxide stress relief portion 28. The presence of the amorphous carbon hardmask 24 over the silicon oxide stress relief portion during the etch prevents etching of the top portion of the silicon oxide stress relief portion. This prevents deformation such as rounding of corners, and retains the full thickness of the silicon oxide stress relief portion. Such trimming enables the width of the trimmed silicon oxide stress relief portion 28 to be reduced to less than the minimum width attainable using only photolithographic patterning.

Figure 3D:
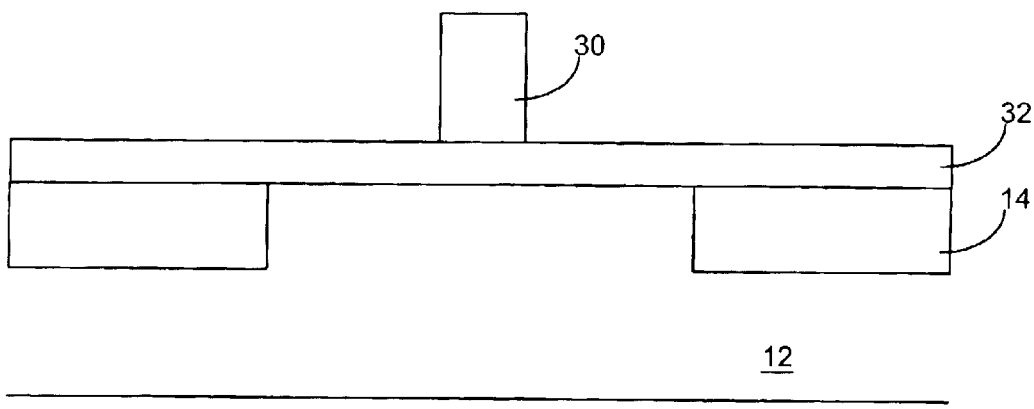

FIG. 3d shows the structure of FIG. 3c after removal of the amorphous carbon hardmask and patterning of the gate conductive layer using the trimmed silicon oxide stress relief portion as an initial etch mask, resulting in the formation of a gate structure comprising a narrow polysilicon gate line 30.

Further processing may be performed after the processing shown in FIGS. 3a–3d, such as formation of spacers, source and drain regions, source and drain contacts, and other types of structures.

While the processing of FIGS. 3a–3d represents one embodiment, in alternative embodiments it may be preferred to trim the amorphous carbon hardmask prior to patterning of the silicon oxide stress relief layer and the polysilicon layer. The presence of the silicon oxide stress relief layer enables a narrow amorphous carbon hardmask to be patterned without significant risk of delamination. In this manner, trimming of both the amorphous carbon hardmask and the silicon oxide stress relief portion contribute to the further reduction of gate width.

Figure 4:
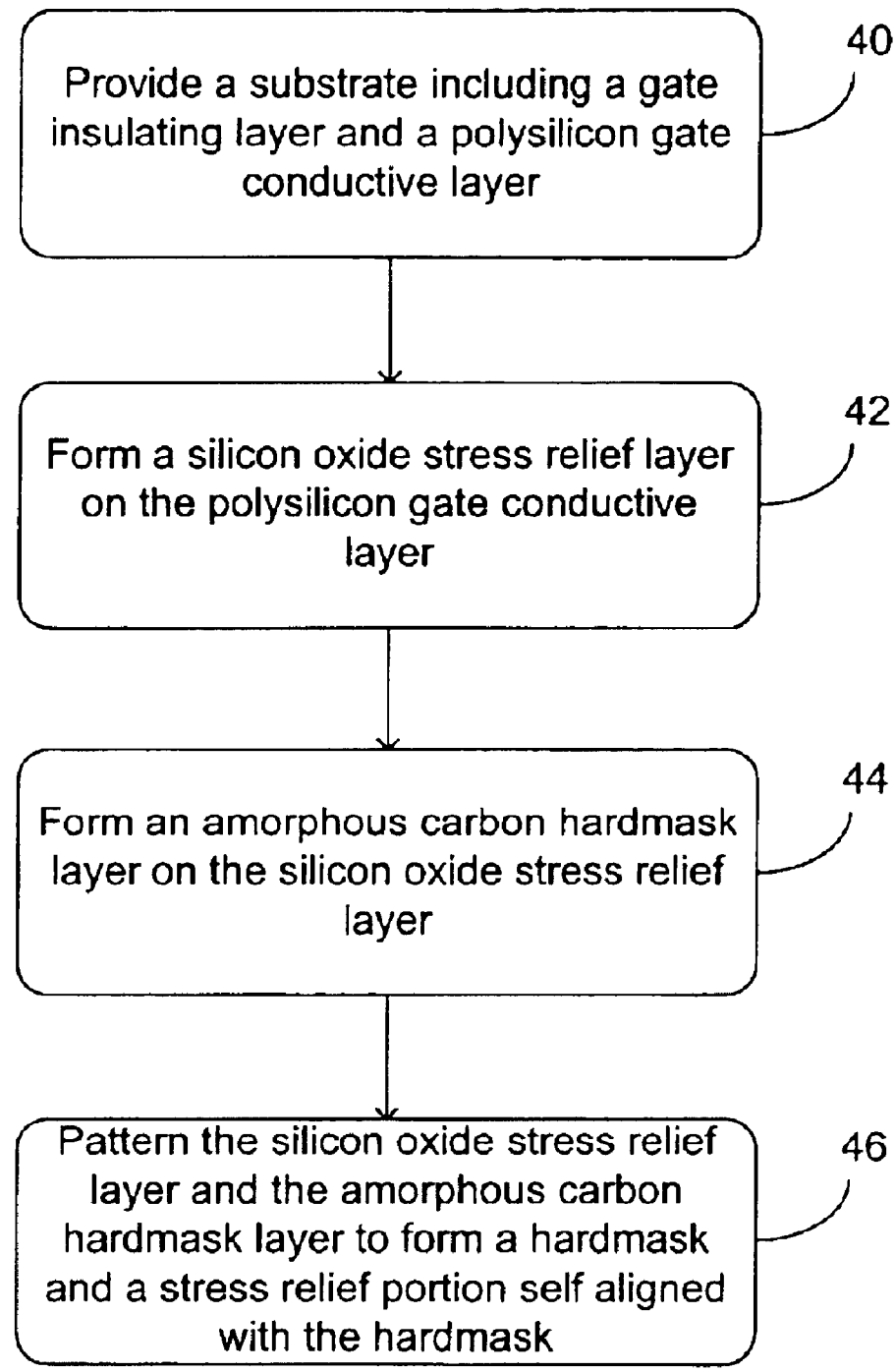
FIG. 4 shows a first process flow encompassing the preferred embodiment and alternative embodiments.

A process flow of a first embodiment encompassing the preferred embodiment and alternatives thereto is shown in FIG. 4. Initially a substrate is provided (40). The substrate includes a gate insulating layer and a polysilicon gate conductive layer formed on the gate insulating layer. A silicon oxide stress relief layer is then formed on the polysilicon gate conductive layer (42). An amorphous carbon hardmask layer is then formed on the silicon oxide stress relief layer (44). The amorphous carbon hardmask layer and silicon oxide stress relief layer are then patterned to form an amorphous carbon hardmask and a silicon oxide stress relief portion self aligned with the amorphous carbon hardmask (46).

Further processing may then be performed, such as trimming the silicon oxide stress relief portion and using the trimmed silicon oxide as an etch mask to etch the polysilicon gate conductive layer, and patterning the polysilicon gate conductive layer using the amorphous carbon hardmask as an etch mask to form a narrow polysilicon gate. The amorphous carbon hardmask may be trimmed prior to patterning of the silicon oxide stress relief portion so as to provide a further reduction in gate width.

Figure 5:
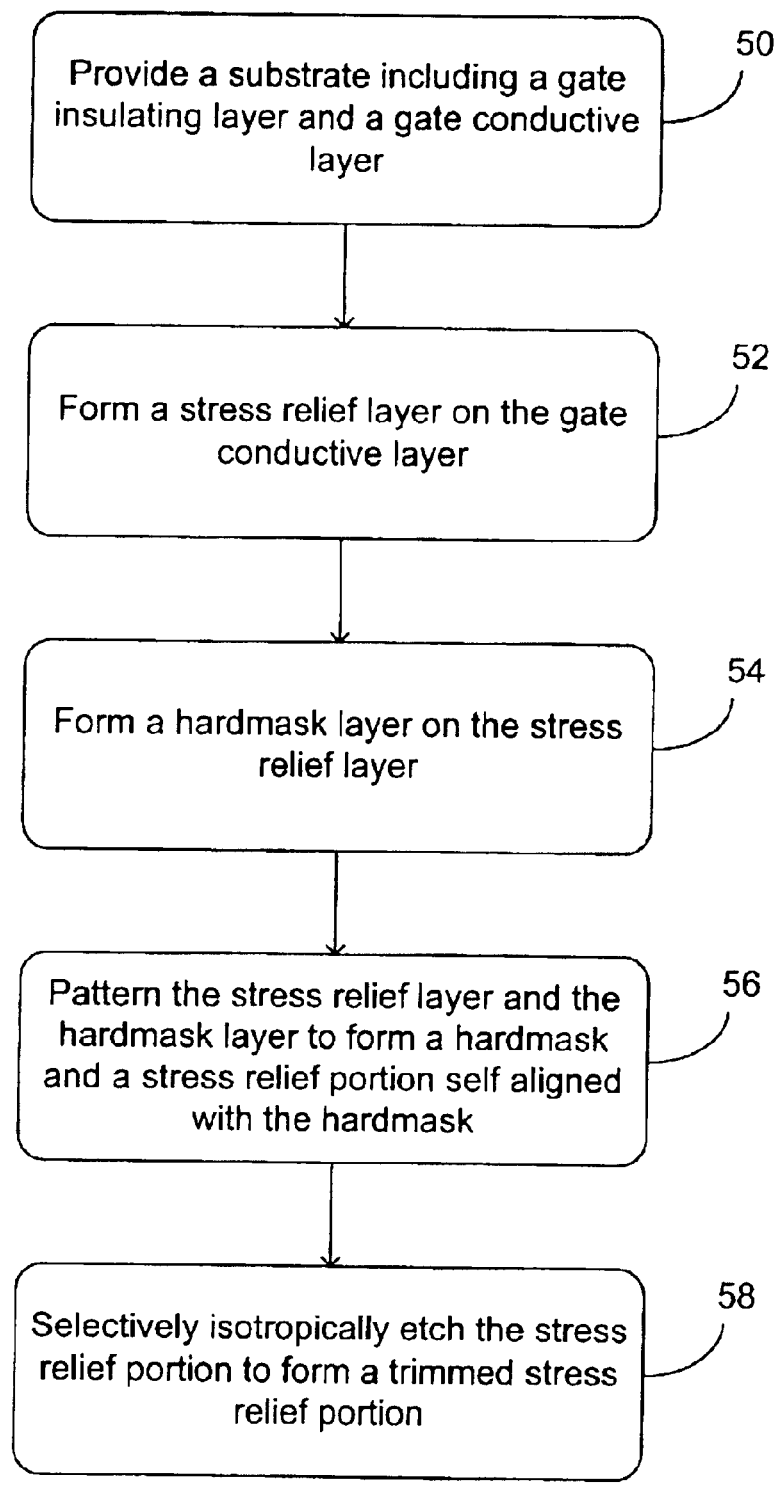
FIG. 5 shows a second process flow encompassing the preferred embodiment and alternative embodiments.

A process flow of a second embodiment encompassing the preferred embodiment and alternatives thereto is shown in FIG. 5. Initially a substrate is provided (50). The substrate includes a gate insulating layer and a gate conductive layer formed on the gate insulating layer. A stress relief layer is then formed on the gate conductive layer (52). A layer of a hardmask material is then formed on the stress relief layer (54). The stress relief layer and the layer of hardmask material are then patterned to form a hardmask and a stress relief portion self aligned with the hardmask (56). The stress relief portion is then selectively isotropically etched to form a trimmed stress relief portion (58).

Further processing such as removing the hardmask and patterning the gate conductive layer using the stress relief portion as an etch mask may then be performed. The hardmask may be trimmed prior to patterning of the stress relief portion so as to provide a further reduction in gate width.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for fabricating a semiconductor device comprising:

providing a substrate including a gate insulating layer and a polysilicon gate conductive layer formed on the gate insulating layer;

forming a silicon oxide stress relief layer on the polysilicon gate conductive layer;

forming an amorphous carbon hardmask layer on the silicon oxide stress relief layer; and patterning the amorphous carbon hardmask layer and the silicon oxide stress relief layer to form an amorphous carbon hardmask and a silicon oxide stress relief portion self aligned with the hardmask.

2. The method claimed in claim 1, further comprising patterning the polysilicon gate conductive layer using the amorphous carbon hardmask as an etch mask.

3. The method claimed in claim 1, further comprising selectively isotropically etching the silicon oxide stress relief portion to form a trimmed silicon oxide stress relief portion.

4. The method claimed in claim 3, further comprising:

removing the amorphous carbon hardmask from the trimmed silicon oxide stress relief portion; and patterning the polysilicon gate conductive layer using the trimmed silicon oxide stress relief portion as an etch mask.

5. The method claimed in claim 1, wherein forming the silicon oxide stress relief layer comprises oxidizing an upper portion of the polysilicon gate conductive layer.

6. The method claimed in claim 1, wherein forming the silicon oxide stress relief layer comprises depositing silicon oxide over the polysilicon gate conductive layer.

7. The method claimed in claim 1, wherein patterning the amorphous carbon hardmask layer and the silicon oxide stress relief layer comprises:

patterning the amorphous carbon hardmask layer to form an amorphous carbon hardmask;

trimming the amorphous carbon hardmask; and patterning the silicon oxide stress relief layer to form a silicon oxide stress relief portion after trimming the amorphous carbon hardmask.

8. A method for fabricating a semiconductor device comprising:

providing a substrate including a gate insulating layer and a gate conductive layer formed on the gate insulating layer;

forming a stress relief layer on the gate conductive layer;

forming a layer of a hardmask material on the stress relief layer;

patterning the layer of hardmask material and the stress relief layer to form a hardmask and a stress relief portion self aligned with the hardmask; and selectively isotropically etching the stress relief portion to form a trimmed stress relief portion.

9. The method claimed in claim 8, further comprising:

removing the hardmask from the trimmed stress relief portion; and patterning the conductive layer using the trimmed stress relief portion as an etch mask.

10. The method claimed in claim 8, wherein the gate conductive layer comprises polysilicon, the stress relief layer comprises silicon oxide, and the hardmask material comprises amorphous carbon.

11. The method claimed in claim 10, wherein forming the stress relief layer comprises oxidizing an upper portion of the gate conductive layer.

12. The method claimed in claim 10, wherein forming the stress relief layer comprises depositing silicon oxide over the gate conductive layer.

13. The method claimed in claim 8, wherein patterning the layer of hardmask material and the stress relief layer comprises:

patterning the layer of hardmask material to form a hardmask;

trimming the hardmask; and patterning the stress relief layer to form a stress relief portion after trimming the hardmask.

* * * * *